United States Patent [19]

Lee

[11] 3,900,596

[45] Aug. 19, 1975

[54] METHOD OF PROTECTING EMBEDDED ELECTRONIC COMPONENTS

[75] Inventor: S. Yen Lee, Upper Marlboro, Md.

[73] Assignee: The United States of America as represented by the Secretary of the Army, Washington, D.C.

[22] Filed: Sept. 27, 1973

[21] Appl. No.: 401,313

[52] U.S. Cl. .......... 427/58; 260/32.8 R; 260/33.4 R; 427/96; 427/385; 427/421; 427/430; 428/482

[51] Int. Cl.² .......... C09D 3/68

[58] Field of Search .......... 117/5.5, 201, 212, 218, 117/161 K; 264/135, 272; 29/578, 588; 260/32.8 R, 33.4 R, 75 R; 427/96, 385, 421, 430; 428/482

[56] References Cited

UNITED STATES PATENTS

| | | | |
|---|---|---|---|
| 2,465,319 | 3/1949 | Whinfield et al. | 260/75 R |
| 3,749,601 | 7/1973 | Tittle | 264/272 X |

FOREIGN PATENTS OR APPLICATIONS

| | | | |
|---|---|---|---|
| 941,647 | 11/1963 | United Kingdom | 117/161 |

*Primary Examiner*—Harry J. Gwinnell
*Attorney, Agent, or Firm*—Nathan Edelberg; Robert P. Gibson; Saul Elbaum

[57] ABSTRACT

In a method for the protection of embedded electronic components, e.g., microcircuits, embedded or encapsulated in a plastic material capable of protecting the electronic component from high temperatures and physical shock, the improvement comprising initially covering the electronic component with a highly solvent resistant poly(butylene terephthalate).

9 Claims, No Drawings

METHOD OF PROTECTING EMBEDDED ELECTRONIC COMPONENTS

RIGHTS OF THE GOVERNMENT

The invention described herein may be manufactured, used and licensed by or for the United States Government for governmental purposes without the payment to me of any royalty thereon.

BACKGROUND OF THE INVENTION

This invention relates to a method for protecting electronic components from the action of solvents generally used to remove plastic embedding materials for purposes of repairing said electronic components and more particularly, to a method of utilizing a covering or coating material functioning as a masking coating and capable of exhibiting resistance to the action of solvents generally used to remove embedding materials.

Plastic embedding has been a common technique used to protect electronic and electric components, especially microcircuits. However, it has always been a problem to remove the embedding material in order to repair the electric components without causing any damage to the embedded electronic component. Although numerous chemical and mechanical processes are currently available, and presently in use, they all appear to be expensive and time consuming as well as creating a high risk of possible damage to embedded electronic components when the embedding material is to be removed.

Masking coatings have been used in the past as one means of protecting an electronic component, but the solvents generally used to remove the embedding materials usually result in the destruction of the otherwise protective masking coating for the electronic component. Accordingly, a need therefore exists for a method of protecting electronic components whereby the embedding or encapsulating material can effectively be removed without causing damage to electronic components.

OBJECTS OF THE INVENTION

It is therefore a significant object of this invention to provide a method for protecting electronic components, e.g., microcircuits, by means of first applying a protective coating about the electronic component, said coating having such properties as resistance to common organic solvents normally used to remove embedding materials, stability at relatively high temperatures, and resistance to scratching and abrasion.

A further object of this invention is the provision of a coating material capable of exhibiting good adherence to substrate materials and capable of being applied in the form of a thin layer without having discontinuities, such as pinholes.

A still further object of this invention is the provision of a simple and efficient process enabling the efficient removal of the embedding or encapsulating material covering the electronic component without having to resort to expensive and time-consuming processes as well as running the risk of damaging the electronic component.

BRIEF SUMMARY OF THE INVENTION

Briefly, this invention relates to a method for protecting embedded electronic components comprising the provision of an electronic component having a surface and embedding or encapsulating the electronic component with a plastic material capable of protecting the electronic component from high temperatures and physical shocks with the improvement of the invention residing in the initial covering of the electronic component with highly solvent resistant poly(butylene terephthalate) coating prior to embedding or encapsulating the same.

DETAILED DESCRIPTION OF THE INVENTION

The poly(butylene terephthalate) is a crystalline polymer formed by the polycondensation of 1,4-butanediol and dimethylterephthalate. The polymer used in the practice of this invention generally has a molecular weight range of about 10,000 to about 1 million with a molecular weight range of about 100,000 being preferred for the practice of this invention.

The polymer is applied to the surface of an electronic component by any number of conventional methods including spray-coating, dipping, etc. The polymer is preferably applied in combination with a solvent capable of dissolving the highly solvent-resistant coating material. The only known solvents for this purpose include 1,1,1,3,3,3-hexafluoro-2-propanol, hexafluoroacetone sesquihydrate and mixtures thereof. Although the polymer is generally used in an effective amount for obtaining a continuous coating on the desired substrate, the amount of polymer generally employed with the solvent is about 2 to 20 weight percent and preferably 5 to 10 weight percent of the total composition. The amount of solvent employed in the composition is generally between about 80 to 98 weight percent and preferably between about 90 and 95 weight percent of the total composition.

When the poly(butylene terephthalate) formulation is applied to a substrate, it is applied in an amount sufficient to provide a coating having a thickness of between about 2 and 6 mils and preferably about 4 mils.

As noted above, the solvents can be utilized in an admixture. According to a preferred embodiment of this invention, admixtures of said solvents are desired, and when employed, the ratio of 1,1,1,3,3,3-hexafluoro-2-propanol to hexafluoroacetone sesquihydrate generally ranges from about 1:1 to about 5:1.

A specific example of a composition used in the practice of this invention is set forth in the following illustrative example:

ILLUSTRATIVE EXAMPLE

| | weight percent |
|---|---|
| Valox a product of The General Electric Company [poly(butylene terephthalate)]having a molecular weight of about 100,000, specific gravity of about 1.41 cu.in./lb. at 73° F.; a tensile strength of about 8,000 psi; and a flexural modulus of about 340,000 psi | 7.0 |
| 1,1,1,3,3,3-hexafluoro-2-propanol | 63.0 |
| hexafluoroacetone sesquihydrate | 30.0 |

Electronic components coated with the poly(butylene terephthalate) formulation and permitted to dry were found to be unaffected by such solvents used to remove plastic embedding or encapsulating materials which include dimethylformamide, acetone, aliphatic hydrocarbons, gasoline, trichloroethylene, carbon tetrachloride, perchloroethylene, oils and fats, alcohols, glycols, ethers, high molecular weight esters and detergents, dilute acids and bases, detergents and most aqueous salt solutions.

I wish it to be understood that I do not desire to be limited to the exact details of construction shown and described, for obvious modifications can be made by a person skilled in the art.

Accordingly, what is claimed is:

1. A method for the protection of embedded electronic components embedded in a plastic material capable of protecting said electronic components from high temperature and physical shock which comprises a. applying onto the surface of said electronic components a highly solvent resistant poly(butylene terephthalate) in an amount sufficient to provide a continuous coating on said electronic components, wherein 1. said continuous coating has a thickness of from about 2 to 6 mils and
2. said poly(butylene terephthalate) is applied in an organic solvent solution of 2 to 20 weight percent poly(butylene terephthalate) in said solution, and b. drying said continuous coating.

2. The method of claim 1 wherein said poly(butylene terephthalate) has a molecular weight of between about 10,000 and 1 million.

3. The method of claim 2 wherein said poly(butylene terephthalate) has a molecular weight of about 100,000.

4. The method of claim 1 comprising applying to said surface a coating of a composition comprising said resin and a solvent selected from the group consisting of 1,1,1,3,3,3-hexafluoro-2-propanol, hexafluroacetone sesquihydrate and mixtures thereof.

5. The method of claim 4 wherein said poly(butylene terephthalate) has a molecular weight of between about 10,000 and 1 million.

6. The method of claim 4 wherein said poly(butylene terephthalate) has a molecular weight of about 100,000.

7. The method of claim 6 wherein said coating is applied by dipping said surface into said composition.

8. The method of claim 6 wherein said coating is applied by spraying said composition onto said surface.

9. The method of claim 4 wherein said compositions comprises about 7 weight percent of poly(butylene terephthalate) having a molecular weight of about 100,000; about 63 weight percent of 1,1,1,3,3,3-hexafluoro-2-propanol; and 30 weight percent of hexafluoroacetone sesquihydrate.

* * * * *